CIRCUIT BOARD CONNECTING AND MOUNTING ARRANGEMENT

Filed April 8, 1964

INVENTORS
HARRY D. FETTEROLF
BEUFORD E. TINDAL

BY

Ronald M. O'Keefe

United States Patent Office 3,281,627 Patented Oct. 25, 1966

3,281,627
CIRCUIT BOARD CONNECTING AND MOUNTING ARRANGEMENT

Harry D. Fetterolf, Santa Clara, Calif., and Beuford E. Tindal, Phoenix, Ariz., assignors to General Electric Company, a corporation of New York Filed Apr. 8, 1964, Ser. No. 358,236
6 Claims. (Cl. 317—101)

Figures 1, 2:
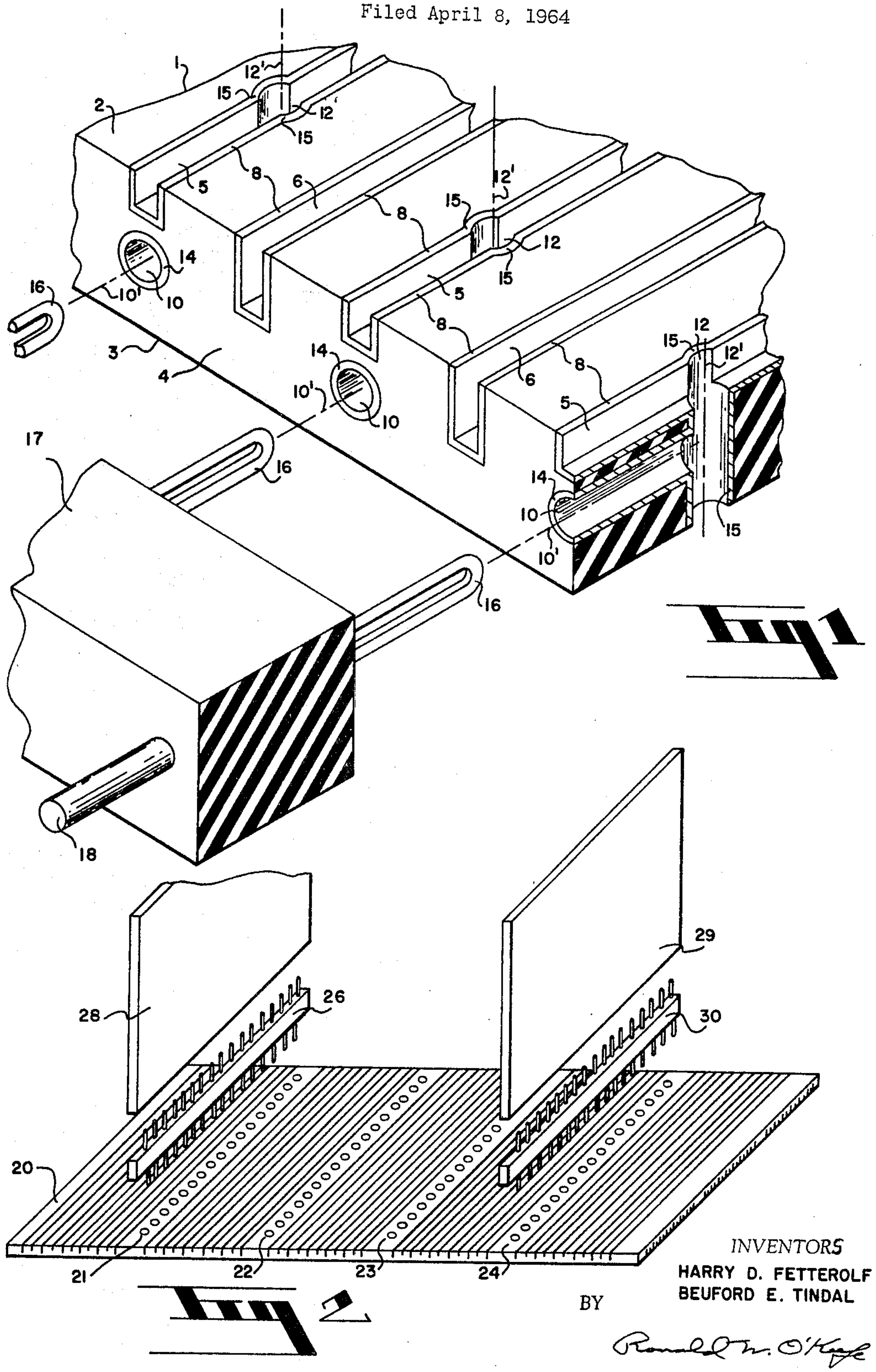

This invention relates to circuit boards and more specifically to an arrangement for making electrical connections to and for mounting circuit boards, particularly those having closely spaced conductors.

It is an object of the invention to provide an improved arrangement for making electrical connections to a circuit board.

It is another object of the invention to provide a circuit board structure which reduces the number of separate components required to make electrical connection to the circuit board.

It is another object of the invention to provide an arrangement for making electrical connections to the edge of a circuit board without overlapping the side surfaces of the circuit board.

It is a further object of the invention to provide an improved circuit board structure which facilitates the mounting of the circuit board on a back panel.

Briefly stated, in accordance with the illustrated embodiment of the invention, an insulative panel is provided having a plurality of signal conductors supported on a side of the panel, the signal conductors terminating adjacent an edge of the panel. A first set of holes is formed in the edge surface of the panel, each hole of the first set corresponding to one of the signal conductors. A second set of holes is formed in the insulative panel at a distance from the edge surface, each hole of the second set intersecting a signal conductor and the corresponding hole of the first set. A coating of conductive material is deposited on the walls of each hole. The coated holes of the first set serve as female connectors which are adapted to receive male connector pins. The conductive coatings deposited on the walls of the intersecting holes of the second set provide signal paths between the female connectors in the edge surface of the panel and the corresponding signal conductors. External electrical connection to the signal conductors on the insulative panel may thus be made by insertion of appropriate male connector pins in the female connectors formed in the edge surface of the insulative panel. One or more of the above-described circuit boards may be mounted on a back panel circuit board by the provision of suitable male connector pins extending from the plane of the back panel circuit board.

The subject matter of the invention is particularly pointed out and distinctly claimed in the concluding portion of the specification. The invention, however, both as to organization and a method of operation may best be understood by reference to the following description taken in connection with the accompanying drawing, in which:

FIG. 1 is an enlarged, partially cutaway, perspective view of a part of a circuit board embodying the connecting and mounting structure of the invention; and FIG. 2 is an exploded perspective view illustrating the mounting of a circuit board on a back panel in accordance with the invention.

With reference to FIG. 1, a sheet or panel 1 of insulative material is provided having a pair of oppositely disposed sides 2 and 3 and an edge surface 4. Panel 1, normally of predetermined and uniform thickness, may be fabricated from any suitable insulative material, for example epoxy paper sheet, and may be curved or planar depending upon application requirements. Signal conductors are provided on one or both sides of panel 1. As illustrated in the embodiment of FIG. 1, a plurality of spaced grooves or sulci 5 and 6 are formed in side 2 of the panel. Grooves 5 and 6 are arranged to be non-intersecting and may be parallel. The grooves are alternately deep and shallow, reference numeral 5 identifying the shallow grooves and reference numeral 6 identifying the deep grooves.

Conductors are provided in grooves 5 and 6 by depositing on the bottom and side walls of the grooves a conductive coating 8 such as copper. Conventional deposition techniques may be employed. The conductors in shallow grooves 5 serve as signal conductors. The conductors in deep grooves 6 may be electrically interconnected to provide a shield for the signal conductors in shallow grooves 5, thereby simulating the configuration of a coaxial transmission line with improved high frequency signal transmission characteristics. Alternatively, the signal conductors may comprise conventional printed circuit conductive paths formed directly on side 2 of insulative panel 1.

The circuit board connecting and mounting arrangement of the invention employs a first set of holes 10 formed in edge surface 4 of insulative panel 1, each hole corresponding to a signal conductor on the side of panel 1. The longitudinal axes 10' of holes 10 may be substantially perpendicular to edge surface 4 and substantially parallel to the plane of panel 1.

A second set of holes 12 is provided in panel 1, holes 12 being uniformly spaced from the edge surface 4. Each hole 12 intersects one of the shallow grooves or signal conductors and the corresponding hole 10, as illustrated in the cutaway portion of FIG. 1. Axes 12' of holes 12 may be substantially perpendicular to the plane of panel 1. Holes 12 may pass entirely through panel 1 or may be formed to extend only partially through the panel, so long as holes 12 intersect the respective holes 10.

A coating of conductive material 14 is deposited on the walls of holes 10 to form a female connector adapted to receive a male connector pin. The accurate coating of the holes permits a wire form connector, for example Amphenol Series 220–221, to be plugged directly into the coated hole. This arrangement, in accordance with the invention, obviates the employment of a separate female connector attached to the circuit board and eliminates the contact resistance normally experienced in soldering a female connector to a conductor on the circuit board. Holes 10 may be countersunk prior to the deposition of conductive material on the walls of the holes to facilitate insertion of male connector pins.

Electrical connection between the signal conductors on the circuit board and the female connectors formed by coated holes 10 is provided by also depositing a coating of conductive material 15 on the walls of holes 12. The intersections of holes 12 with the signal conductors and with holes 10 thus enables signal paths to be formed between the signal conductors and the female connectors provided by coated holes 10. The deposition of conductive material on the walls of holes 10 and 12, as well as on the walls of grooves 5, is preferably effected simultaneously in order to provide a continuous coating of conductive material, free of ohmic junctures, between a conductor and the corresponding female connector.

The circuit board structure of the invention enables electrical connections to be conveniently made to the signal conductors of a circuit board from the edge of the circuit board without overlapping the side surfaces of the circuit board. Thus, as illustrated in FIG. 1, male connector pins 16 extending from connector block 17 are inserted in coated holes 10 to make electrical connections to the signal conductors on panel 1. Appropriate electrical signals may be applied to conductors 18 of connector block 17 for application, through the corresponding male connector pins 16, to the respective signal conductors of panel 1.

The circuit board structure of the invention, while providing a convenient arrangement for making electrical connection to the signal conductors of a circuit board through the edge of the board, also provides a means for simultaneously physically mounting the circuit boards. As illustrated in FIG. 2, circuit boards, such as described with reference to FIG. 1, may be conveniently mounted on a larger circuit board or back panel. Thus, circuit boards 28 and 29 may be mounted on back panel 20, the planes of boards 28 and 29 being substantially orthogonal to the plane of panel 20.

Back panel 20 is provided with signal conductors and has a plurality of rows 21–24 of spaced holes formed in a side of the panel. The holes are coated with conductive material and serve as female connectors for reception of male connector pins. The coatings of conductive material on the walls of the holes are in electrical contact with appropriate signal conductors on the opposite side of the back panel. A connector block 26, having appropriately spaced male connector pins extending therefrom, is plugged into the coated holes of row 21 of the back panel. Male connector pins, electrically connected to the pins extending into the back panel are provided for the mounting of a circuit board 28. Circuit board 28 is of the type described with reference to FIG. 1 having coated edge holes electrically connected to signal conductors (not shown) on the board.

Thus, in accordance with the invention, the coated edge holes of circuit board 28 enable electrical connection to be made between the signal conductors of circuit boards 28 and 20 while simultaneously providing a means for mounting board 28 on a back panel. A similar circuit board 29 is mounted on back panel 20 by means of connector block 30 plugged into the coated holes of row 24. Other circuit boards may be similarly mounted at rows 22 and 23 on back panel 20. As an alternative to the use of connector blocks 26 and 30, the male connector pins may extend directly from back panel 20.

While the principles of the invention have now been made clear in illustrative embodiments, there will be immediately obvious to those skilled in the art many modifications in structure, arrangement, proportions, the elements, materials, and components, used in the practice of the invention, and otherwise, which are particularly adapted for specific environments and operating requirements, without departing from those principles. The appended claims are therefore intended to cover and embrace any such modifications, within the limits only of the true spirit and scope of the invention.

What is claimed as new and desired to be secured by Letters Patent of the United States is:

1. A circuit board comprising: an insulative panel having a pair of oppositely disposed sides and an edge surface, at least one signal conductor supported on a side of said panel, at least one hole formed in the edge surface of said panel, a coating of conductive material deposited on the walls of said hole to form a female connector adapted to receive a male connector pin, and means for electrically connecting said coating of conductive material in said hole to said signal conductor to provide a signal path between the female connector and said signal conductor.

2. A circuit board comprising: an insulative panel having a pair of oppositely disposed sides and an edge surface, at least one signal conductor supported on a side of said panel and terminating adjacent the edge surface of said panel, at least one hole formed in the edge surface of said panel, a coating of conductive material deposited on the walls of said hole to form a female connector adapted to receive a male connector pin, and conductive means extending through said insulative panel for electrically connecting said coating of conductive material in said hole to said signal conductor to provide a signal path between the female connector and said signal conductor.

3. A circuit board comprising: an insulative panel having a pair of oppositely disposed sides and an edge surface, a plurality of spaced signal conductors supported on a side of said panel and terminating adjacent the edge surface of said panel, a first set of holes formed in the edge surface of said panel with each hole of said first set corresponding to one of said signal conductors, a second set of holes formed in a side of said panel, each hole of said second set intersecting one of said signal conductors and the corresponding hole of said first set, and a coating of conductive material deposited on the walls of said holes of said first and said second sets, said coating on the walls of said holes of said first set forming female connectors adapted to receive male connector pins and said coating on the walls of said holes of said second set providing signal paths between the respective female connectors and the corresponding signal conductors.

4. An insulative panel having a pair of oppositely disposed sides and an edge surface, at least one groove formed in a side of said panel and terminating adjacent the edge surface of said panel, at least one hole formed in the edge surface of said panel, a coating of conductive material deposited on the walls of said groove to form a signal conductor and on the walls of said hole to form a female connector adapted to receive a male connector pin, and means for electrically connecting said coatings of conductive material in said groove and in said hole to provide a signal path between the female connector and the signal conductor.

5. A circuit board comprising: an insulative panel having a pair of oppositely disposed sides and an edge surface, at least one groove formed in a side of said panel and terminating adjacent the edge surface of said panel, a first hole formed in the edge surface of said panel, a second hole formed in said panel intersecting said groove and said first hole, and a coating of conductive material deposited on the walls of said groove to form a signal conductor and on the walls of said first and said second holes, said coating in said first hole forming a female connector adapted to receive a male connector pin and said coating in said second hole providing a signal path between the female connector and the signal conductor.

6. A circuit board comprising: an insulative panel having a pair of oppositely disposed sides and an edge surface, a plurality of spaced grooves formed in a side of said panel and terminating adjacent the edge surface of said panel, a first set of holes formed in the edge surface of said panel with each hole of said first set corresponding to one of said grooves, a second set of holes formed in a side of said panel, each hole of said second set intersecting one of said grooves and the corresponding hole of said first set, and a coating of conductive material deposited on the walls of said grooves to form signal conductors and on the walls of said holes of said first and said second sets, said coating on the walls of said holes of said first set forming female connectors adapted to receive male connector pins and said coating on the walls of said holes of said second set providing signal paths between the respective female connectors and the corresponding signal conductors.

References Cited by the Examiner

UNITED STATES PATENTS

| | | | |
|---|---|---|---|
| 3,034,087 | 5/1962 | Bohannon | 339—17 |
| 3,200,298 | 8/1965 | Garibotti | 317—101 |
| 3,205,469 | 9/1965 | Frank et al. | 339—18 |

OTHER REFERENCES

HHB General Specifications, Series EC, H. H. Buggie, Inc., p. 14, Terminal Strip, Apr. 1, 1958.

ROBERT K. SCHAEFER, *Primary Examiner.*

KATHLEEN H. CLAFFY, ROBERT S. MACON, *Examiners.*

J. J. BOSCO, *Assistant Examiner.*